(12) United States Patent
Furukawa

(10) Patent No.: US 7,563,638 B2
(45) Date of Patent: Jul. 21, 2009

(54) SEMICONDUCTOR DEVICE AND METHOD FOR MANUFACTURING THE SAME

(75) Inventor: Shinobu Furukawa, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 431 days.

(21) Appl. No.: 11/254,778

(22) Filed: Oct. 21, 2005

(65) Prior Publication Data

US 2006/0094153 A1    May 4, 2006

(30) Foreign Application Priority Data

Oct. 29, 2004    (JP)    ............... 2004-315141

(51) Int. Cl.
  *H01L 51/40*    (2006.01)
(52) U.S. Cl. ............... 438/99; 257/40; 257/E21.007; 257/E51.005; 438/149
(58) Field of Classification Search ............... 257/40, 257/E21.007, E51.005; 438/99, 149
  See application file for complete search history.

(56) References Cited

U.S. PATENT DOCUMENTS 6,326,640 B1    12/2001    Shi et al.

2004/0195962 A1 *    10/2004    Nakamura et al. ........... 313/504
2005/0127354 A1 *    6/2005    Hanna et al. ................... 257/40
2005/0194640 A1 *    9/2005    Lazarev ....................... 257/347

FOREIGN PATENT DOCUMENTS

JP    09-232589    9/1997

* cited by examiner

*Primary Examiner*—Asok K Sarkar
(74) *Attorney, Agent, or Firm*—Fish & Ricahrdson P.C.

(57) ABSTRACT

The present invention provides a method by which molecules in an organic semiconductor layer can be oriented so as to make molecules in an organic semiconductor layer be oriented without damaging the organic semiconductor layer by rubbing and by which molecules in an organic semiconductor layer are oriented without losing the planarity of an interface between a gate insulating film and an organic semiconductor layer by rubbing the gate insulating film, in manufacturing an organic semiconductor having molecular orientation. One feature of the invention is that molecules in an organic semiconductor layer are highly oriented by providing a second substrate provided with an orientation film to a first substrate having a gate electrode, a gate insulator layer, a source electrode, a drain electrode, and an organic semiconductor layer so that the orientation film is in contact with the organic semiconductor layer, then applying heat, or rapidly or slowly cooling after applying heat, in manufacturing a semiconductor device.

20 Claims, 10 Drawing Sheets

SEMICONDUCTOR DEVICE AND METHOD FOR MANUFACTURING THE SAME

BACKGROUND OF THE INVENTION

1. Field of the Invention

The present invention relates to a method for manufacturing a semiconductor device using an organic semiconductor.

2. Description of the Related Art

Nowadays, the active functionality of an organic semiconductor attracts attention, and a semiconductor element using an organic semiconductor is widely studied. In terms of the capability of material design, functionality added to an organic semiconductor has infinite possibilities, and an advantage due to utilizing an organic material as a semiconductor is immeasurable.

However, a semiconductor element using an organic semiconductor generally has low carrier mobility compared with a semiconductor element using an inorganic semiconductor; therefore, further enhancement of carrier mobility of an organic semiconductor element is one of the tasks of applying an organic semiconductor to a semiconductor element.

The basic structure unit of an organic semiconductor is a molecule, and the aggregation structure of the organic semiconductor is formed due mainly to intermolecular force. Hence, the film quality (amorphous, poly-crystal, or single crystal), molecular sequence, or molecular orientation of an organic semiconductor depends on a molecule-specific shape (spherical shape, planar shape, straight chain shape, or the like), a film formation method, or a substrate.

It is well known that molecules are oriented vertically or parallel to a substrate in accordance with a molecular shape under the restraint of, especially, a substrate in the case of forming a thin film using an organic semiconductor.

In the case of π-conjugated system straight chain molecules such as pentacene, carriers are easy to flow since π electron interaction is strong in a stacking direction in which molecular aspects are face to face with each other. Therefore, in the case where π-conjugated system straight chain molecules are oriented vertically, carriers flow in a direction perpendicular to a long axis of a molecule. In the case of employing a horizontal structure such as an organic field effect transistor, it is understood that carrier mobility is improved when the molecular orientation of pentacene is oriented vertically.

Carrier mobility of a semiconductor element using an organic semiconductor can be improved by controlling the molecular sequence of a semiconductor element and making molecules be oriented so that carrier mobility is improved in an organic semiconductor layer (so that the overlap of π-π between molecules is generated in a direction which carriers flow between a source electrode and a drain electrode) (for example, refer to Patent Document 1: Japanese Patent Laid-Open No. H9-232589)

A rubbing method can be given as a method for controlling molecular orientation of an organic semiconductor. A rubbing method is a method for obtaining orientation capacity for the molecules of an organic semiconductor layer by rubbing an organic semiconductor layer directly or an orientation film provided over a substrate in one direction with a cloth having long hairs or the like. Accordingly, orientation treatment of a large-sized substrate can be carried out in a short period of time, and uniform in-plane orientation (uniaxial orientation) of molecules to a whole surface can be obtained.

Desired molecular orientation can be formed and carrier mobility can be improved by using an organic semiconductor layer in which molecules are oriented by a rubbing method for a semiconductor element. However, some problems occur in the case of performing rubbing treatment for an organic semiconductor layer to be applied to a semiconductor element.

As one of the problems, an organic semiconductor layer which forms a channel is physically damaged by rubbing the organic semiconductor layer which forms a channel due to the softness which is specific to an organic semiconductor material, which leads to a problem that OFF current increases or gate leak current may occur due to the breakdown of a gate insulating film. Secondly, in the case of rubbing a gate insulating film to orient molecules in an organic semiconductor layer stacking over the gate insulating film, a minute groove structure is formed by performing rubbing treatment over the surface of the gate insulating film; therefore, a planar surface cannot be obtained in the interface between an organic semiconductor which forms a channel and the gate insulating film, which leads to a problem that carrier mobility is difficult to be sufficiently improved.

SUMMARY OF THE INVENTION

On the other hand, in the case where an orientation film does not exist over an organic semiconductor layer, it is difficult to obtain molecular orientation. When molecular orientation cannot be obtained, carrier mobility is drastically lowered. Therefore, a rubbing method described above, that is, rubbing an organic semiconductor layer directly or a gate insulating film is required in manufacturing an organic semiconductor having molecular orientation. It is an object of the present invention to provide a method which can make molecules in an organic semiconductor layer be oriented without damaging the organic semiconductor layer by rubbing, and a method for making molecules in an organic semiconductor layer be oriented without losing the planarity of the interface between a gate insulating film and the organic semiconductor layer by rubbing the gate insulating film. It is another object of the invention to provide a semiconductor device using an organic semiconductor showing preferable operating characteristics.

One feature of the invention is that molecules in an organic semiconductor layer are oriented by providing a second substrate provided with an orientation film to a first substrate having a gate electrode, gate insulator layer, a source electrode, a drain electrode, and an organic semiconductor layer so that the orientation film is in contact with the organic semiconductor layer, then heating and melting the organic semiconductor layer, in manufacturing a semiconductor device. Further, an organic semiconductor layer may be rapidly cooled after the organic semiconductor layer is heated and molecules in the organic semiconductor layer are oriented so that orientation does not return.

One embodiment of the invention provides a method for manufacturing a semiconductor device including the steps of forming a semiconductor element in which an organic semiconductor film is partly or wholly exposed at a surface of the semiconductor element over a first substrate; forming an orientation film over a second substrate; providing the first substrate and the second substrate so that the orientation film is in contact with the surface of the organic semiconductor film; and heating the first substrate and the second substrate.

Another embodiment of the invention is that molecules in an organic semiconductor layer is oriented by providing a second substrate provided with an orientation film is formed to a first substrate having a gate electrode, gate insulator layer, a source electrode, and a drain electrode so that the orientation film is in a first substrate side, then forming an organic semiconductor layer between the first substrate and the second substrate, in manufacturing a semiconductor device.

In other words, a method for manufacturing a semiconductor device including the steps of forming a gate electrode, an insulator layer, a source electrode, and a drain electrode over a first substrate; forming an orientation film over a second substrate; forming a seal pattern having an opening portion over the first substrate; stacking the first substrate and the second substrate so that the orientation film provided over the second substrate is in a first substrate side; and injecting an organic semiconductor material from the opening portion to fill a space surrounded by the seal pattern, the first substrate, and the second substrate.

Another embodiment of the invention is a method for manufacturing a semiconductor device including the steps of forming a gate electrode over a first substrate; forming an insulator layer over the gate electrode; forming a source electrode and a drain electrode over the insulator layer; forming an orientation film over a second substrate; forming a seal pattern having an opening portion over the first substrate; stacking the first substrate and the second substrate so that the orientation film provided over the second substrate is in a first substrate side; and injecting an organic semiconductor material from the opening portion to fill a space surrounded by the seal pattern, the first substrate, and the second substrate.

One feature of the invention is that molecules in an organic semiconductor layer are oriented by having a structure provided with a second substrate provided with an orientation film to a first substrate having a gate electrode, a gate insulator layer, a source electrode, a drain electrode, and an organic semiconductor layer so that the orientation film is in contact with the organic semiconductor layer.

In other words, one embodiment of the invention is a semiconductor device including a first conductive film provided over a first substrate having an insulating surface; an insulating film provided over the first conductive film; a pair of second conductive films provided over the insulating film; an organic semiconductor film provided over the pair of second conductive films; an orientation film provided over the organic semiconductor film; and a second substrate provided over the orientation film.

Another embodiment of the invention is a semiconductor device including a first conductive film provided over a first substrate having an insulating surface; an insulating film provided over the first conductive film; an organic semiconductor film provided over the insulating film; a pair of second conductive films provided over a part of the organic semiconductor film; and an orientation film provided over the organic semiconductor film, wherein the orientation film exists between the pair of second conductive films, and wherein a second substrate is provided over the pair of second conductive films and the orientation film.

Further, following films are preferable to be used as the orientation film of the invention: a film processed by the rubbing method, an oblique deposition film using SiO etc., a film having a surface on which macromolecule chain are stretched, a film processed by the surfactant such as silane compound etc., and a film irradiated by the polarized ultraviolet light.

According to the invention, orientation is formed from a surface side being in contact with an orientation film of an organic semiconductor layer after forming the organic semiconductor layer; therefore, the increase of OFF current or gate leak current due to damage in case of rubbing an organic semiconductor layer directly can be suppressed. Further, since there is no damage which is to be formed by rubbing an insulating surface directly, an organic semiconductor layer in which orientation of molecules in the organic semiconductor layer is uniform mostly or at high rates can be obtained without damaging the planarity of the interface between an organic semiconductor which forms a channel and a gate insulator. Therefore, a semiconductor device showing favorable characteristics and increasing carrier mobility in an organic semiconductor layer can be provided.

According to the invention, carrier mobility of an organic semiconductor layer due to orientation can be improved while the planarity of an interface between an organic semiconductor and a gate insulator is maintained.

These and other objects, features and advantages of the present invention will become more apparent upon reading of the following detailed description along with the accompanied drawings.

DETAILED DESCRIPTION OF THE INVENTION

Figure 1A:
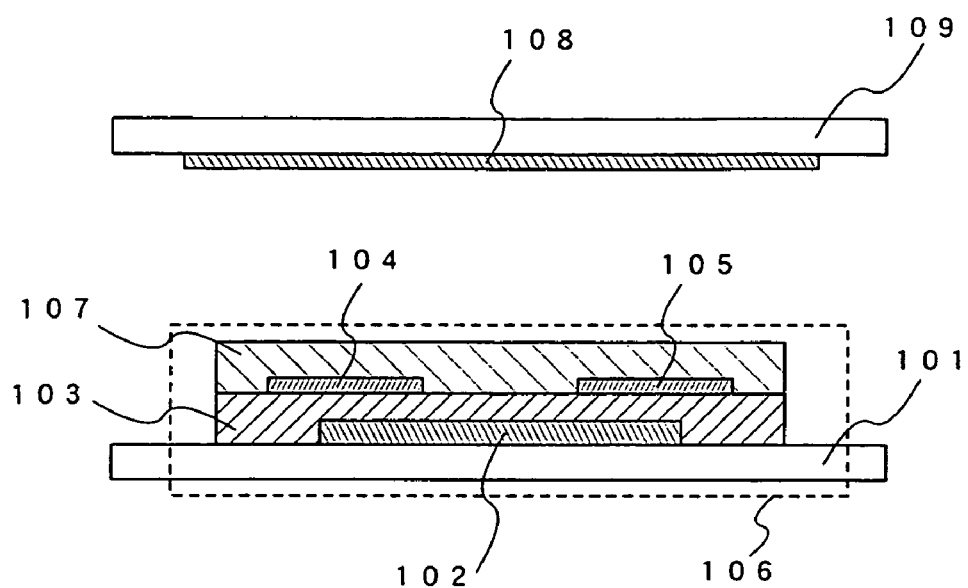
FIGS. 1A to 1C are explanatory views of a method for manufacturing a semiconductor device according to the present invention.

Hereinafter, embodiment modes according to the present invention are described. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention.

Embodiment Mode 1

One mode of a semiconductor device and a manufacturing method of the semiconductor device according to the present invention is explained with reference to FIGS. 1A to 1C and FIGS. 2A to 2C.

A gate electrode 102 is formed over a first substrate 101. The method for forming the gate electrode 102 is not limited in particular, and a deposited conductive layer may be processed in a desired shape by photolithography, or a droplet containing a conductive material may be formed by an ink-jet method or the like. The material for forming the gate electrode 102 is also not limited in particular, and for example, aluminum, copper, gold, silver, or the like can be used. Further, the first substrate 101 is not limited in particular, and a substrate formed from glass, quartz, or the like, or a flexible substrate such as plastic or polycarbonate can be used.

Subsequently, a gate insulator layer 103 for covering the gate electrode 102 is formed. The method for forming the gate insulator layer 103 is not limited in particular, and for example, an insulator such as silicon oxide or silicon nitride may be deposited by a CVD method or the like, or the surface of the gate electrode may be oxidized by an anodic oxidation method. In addition, the gate insulator layer 103 may be formed by coating the first substrate 101 with an organic substance such as polyimide, polyamic acid, or polyvinylphenol by a cast method, a spinner method, a printing method, an ink-jet method, or the like.

Then, a source electrode 104 and a drain electrode 105 are formed over the gate insulator layer 103. The material of the source electrode 104 and the drain electrode 105 is not limited in particular, and an organic conductive material or the like including poly(ethylenedioxythiophene)/poly(styrene sulfonate) mixture (PEDOT/PSS) or the like besides an inorganic conductive material such as gold, silver, or tungsten may be used. Further, the method for forming the source electrode 104 and the drain electrode 105 is also not limited in particular, and a conductive layer formed using a deposition apparatus such as a sputtering apparatus or a vapor deposition system may be processed in a desired shape, or a droplet containing a conductive material may be formed by an ink-jet method or the like.

And then, an organic semiconductor layer 107 is formed over the gate insulator layer 103, the source electrode 104, and the drain electrode 105. The material of the organic semiconductor layer 107 is not limited in particular when the material is an organic semiconductor, and conjugated polymer as typified by polythiophene or polyparaphenylene vinylene may be used or a low molecular weight material as typified by pentacene or phthalocyanine may be used. In addition, the method for forming the organic semiconductor layer 107 is not limited in particular, and for example, a thin film formation method or the like such as a vacuum vapor deposition method, a spin coating method, an ink-jet method, or a vapor-phase transport method can be given as a typical method.

A structure which is made up through the above described process is an element 106.

A second substrate 109 provided with an orientation film 108 is disposed so that the orientation film 108 faces the organic semiconductor layer 107 (FIG. 1A). The material of the second substrate 109 is not limited in particular, and a substrate formed from glass, quartz, or the like, or a flexible substrate such as plastic or polycarbonate can be used. The orientation film 108 is also not limited in particular, and for example, the orientation film 108 may be formed by coating the second substrate 109 with an organic substance such as polyimide, polyvinylphenol, or polyvinyl alcohol by a cast method, a spinner method, a printing method, an ink-jet method, or the like and may be oriented by rubbing or the like.

Figure 1B:
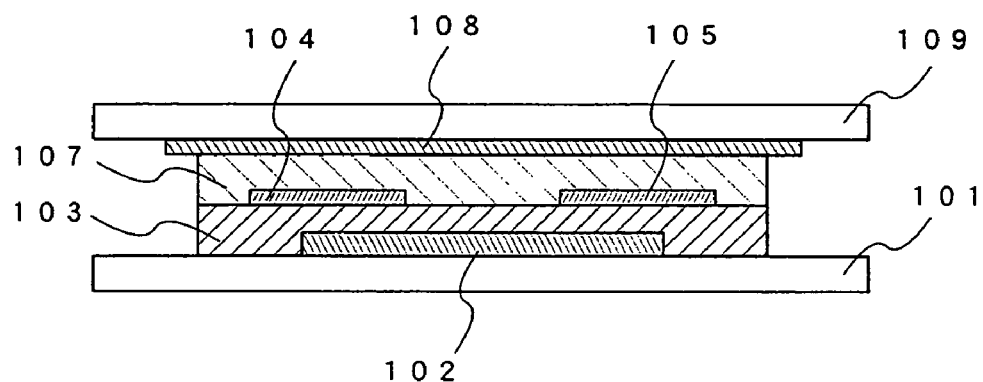
Figure 1C:
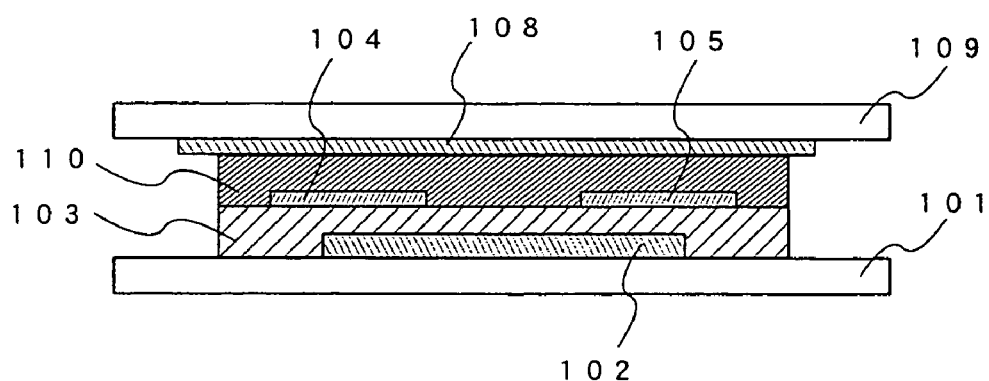

Then, the second substrate 109 provided with the orientation film 108 is made to approach to the first substrate 101 till the orientation film 108 is in contact with the organic semiconductor layer 107 (FIG. 1B). The method for making molecules in the organic semiconductor layer 107 be oriented is not limited in particular, and for example, an organic semiconductor layer 110 having orientation by the orientation film 108 is formed by activating thermal motion of the organic semiconductor layer 107 through compressing and heating the organic semiconductor layer 107 and the orientation film 108 (FIG. 1C), or the organic semiconductor layer 110 is formed through heating and melting the organic semiconductor layer 107 to be oriented. Further, the organic semiconductor layer 110 in which molecules are highly oriented can be formed by rapidly cooling after heating the organic semiconductor layer 107 and orienting molecules in the organic semiconductor layer 107 so that orientation does not return. Further, carrier mobility is made to be more effective when the orientation of molecules in the organic semiconductor layer 110 makes the molecules of the organic semiconductor layer 110 be oriented vertically or horizontally so that carrier mobility is improved (so that the overlap of π-π between molecules is generated in a direction which carriers flow between a source electrode and a drain electrode).

Figure 2A:
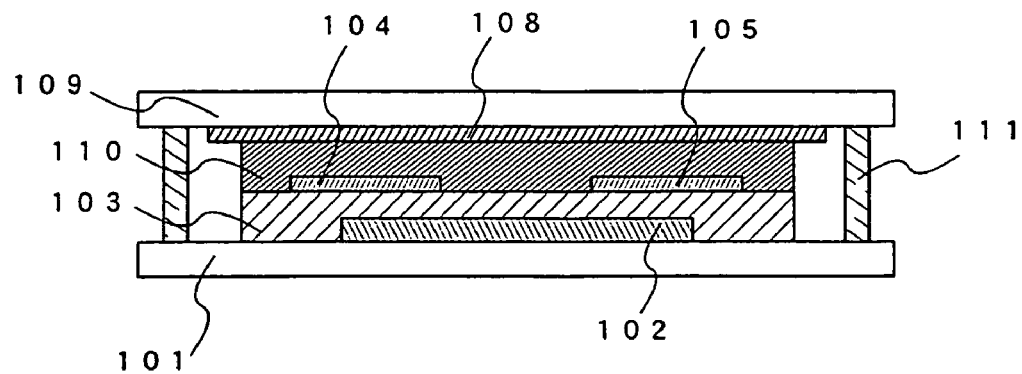
FIGS. 2A to 2C are explanatory views of a method for manufacturing a semiconductor device according to the invention.
Figure 2B:
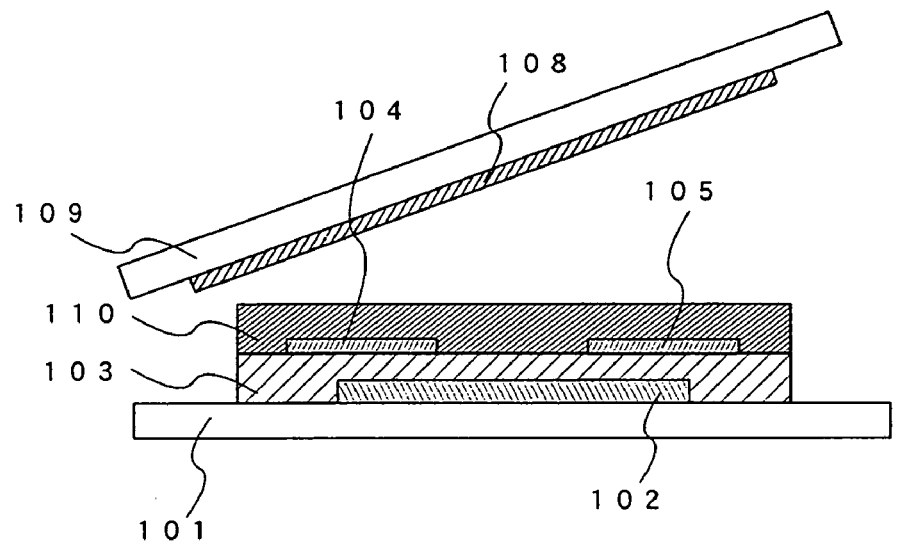

The second substrate 109 provided with the orientation film 108 can be used as a sealing substrate by being attached to the first substrate 101 by a sealing member 111 (FIG. 2A). In addition, a semiconductor device may be formed of a sealing structure by removing the second substrate 109 to provide a sealing substrate in the upper portion after forming the organic semiconductor layer 110, or may be formed by adding a further process such as the formation of an interlayer film (FIG. 2B).

Figure 2C:
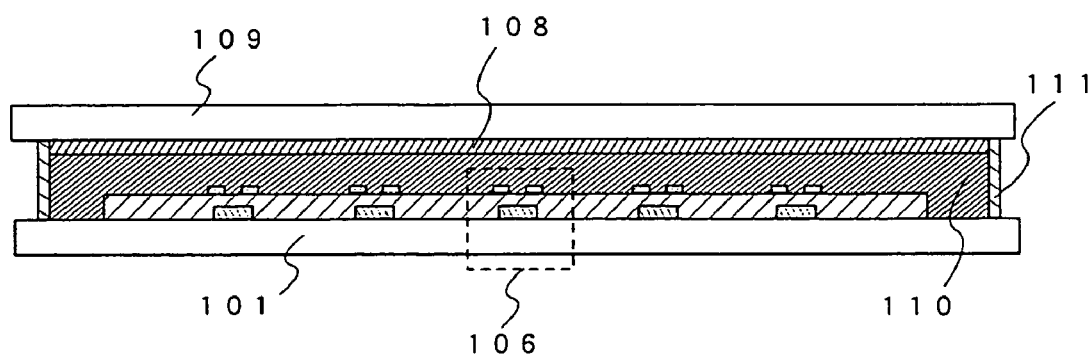

Further, a semiconductor device having a plurality of elements 106 over the first substrate 101 can be formed through a similar step (FIG. 2C).

In the semiconductor device according to the invention manufactured as described above, the orientation film 108 is provided at the side opposite to the gate insulator layer 103 via the organic semiconductor layer 107, in other words, molecules in the organic semiconductor layer 107 are oriented from the surface opposite to the side of the gate insulator layer 103. Accordingly, the molecules of the organic semiconductor layer 107 can be oriented without damaging the organic semiconductor layer 107, and further, the planarity of an interface between the organic semiconductor layer 110 and the gate insulator layer 103 is maintained; therefore, a favorable operating characteristic is shown.

Embodiment Mode 2

One mode of a semiconductor device and a manufacturing method of the semiconductor device according to the present invention is explained with reference to FIGS. 3A to 3C and FIGS. 4A to 4C.

A gate electrode 202 is formed over a first substrate 201. The method for forming the gate electrode 202 is not limited in particular, and a deposited conductive layer may be processed in a desired shape by photolithography, or a droplet containing a conductive material may be formed by an ink-jet method or the like. The material for forming the gate electrode 202 is also not limited in particular, and for example, aluminum, copper, gold, silver, or the like can be used. Further, the first substrate 201 is not limited in particular, and a substrate formed from glass, quartz, or the like, or a flexible substrate such as plastic or polycarbonate can be used.

Subsequently, a gate insulator layer 203 for covering the gate electrode 202 is formed. The method for forming the gate insulator layer 203 is not limited in particular, and for example, an insulator such as silicon oxide or silicon nitride may be deposited by a CVD method or the like, or the surface of the gate electrode may be oxidized by an anodic oxidation method. In addition, the gate insulator layer 203 may be formed by coating the first substrate 201 with an organic substance such as polyimide, polyamic acid, or polyvinylphenol by a cast method, a spinner method, a printing method, an ink-jet method, or the like.

Then, an organic semiconductor layer 205 is formed over the gate insulator layer 203. The material of the organic semiconductor layer 205 is not limited in particular when the material thereof is an organic semiconductor, and conjugated polymer as typified by polythiophene or polyparaphenylene vinylene may be used or low molecular weight material as typified by pentacene and phthalocyanine may be used. In addition, the method for forming the organic semiconductor layer 205 is not limited in particular, and for example, a thin film formation method or the like such as a vacuum vapor deposition method, a spin coating method, an ink-jet method, or a vapor-phase transport method can be given as a typical method.

And then, a source electrode 206 and a drain electrode 207 are formed over the organic semiconductor layer 205. The material of the source electrode 206 and the drain electrode 207 is not limited in particular, and an organic conductive material or the like including poly(ethylenedioxythiophene)/poly(styrene sulfonate) mixture (PEDOT/PSS) or the like besides an inorganic conductive material such as gold or silver may be used. Further, the method for forming the source electrode 206 and the drain electrode 207 is also not limited in particular, and a conductive layer formed using a deposition apparatus such as a sputtering apparatus or a vapor deposition system may be processed in a desired shape, or a droplet containing a conductive material may be formed by an ink-jet method or the like.

A structure which is made up through the above described process is an element 204.

Figure 3A:
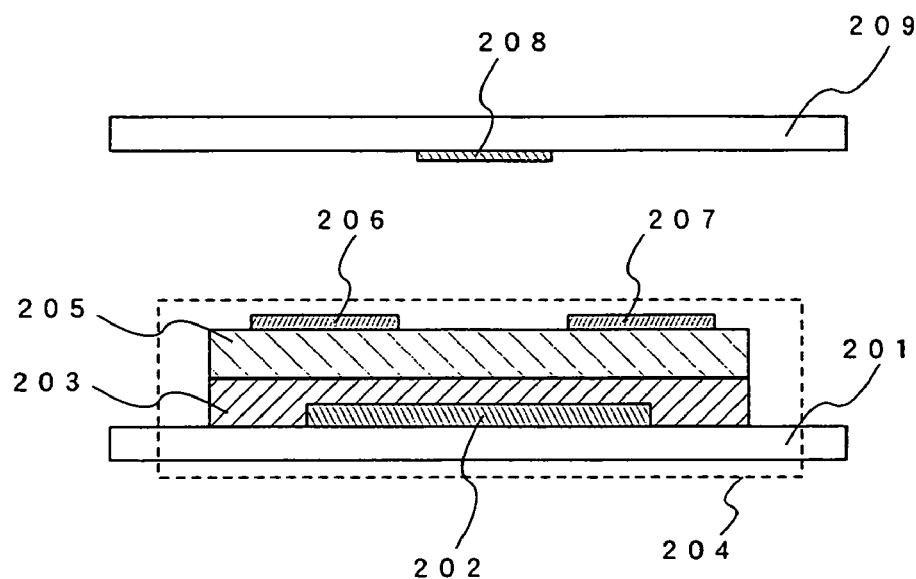
FIGS. 3A to 3C are explanatory views of a method for manufacturing a semiconductor device according to the invention.

A second substrate 209 provided with an orientation film 208 is disposed so that the orientation film 208 faces the organic semiconductor layer 205 (FIG. 3A). The material of the second substrate 209 is not limited in particular, and a substrate formed from glass, quartz, or the like, or a flexible substrate such as plastic or polycarbonate can be used. The material of the orientation film 208 is also not limited in particular, and for example, the orientation film 208 may be formed by coating the second substrate 209 with an organic substance such as polyimide, polyvinylphenol, or polyvinyl alcohol by a cast method, a spinner method, a printing method, an ink-jet method, or the like and may be oriented by rubbing or the like.

Figure 3B:
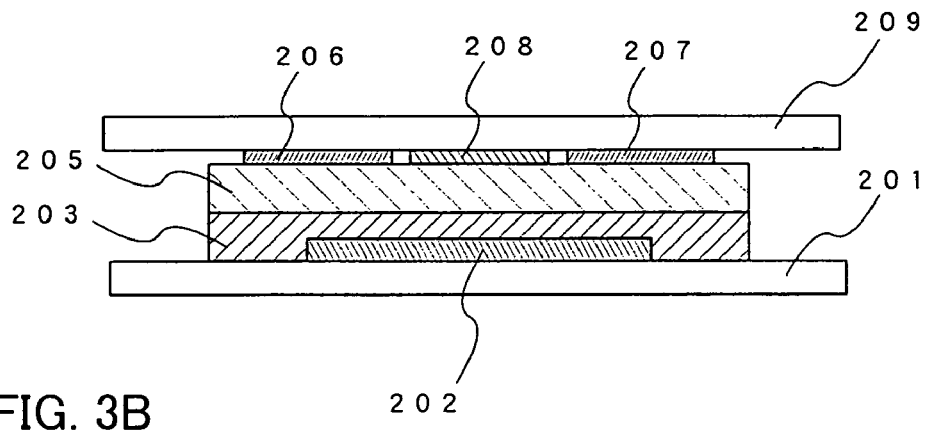
Figure 3C:
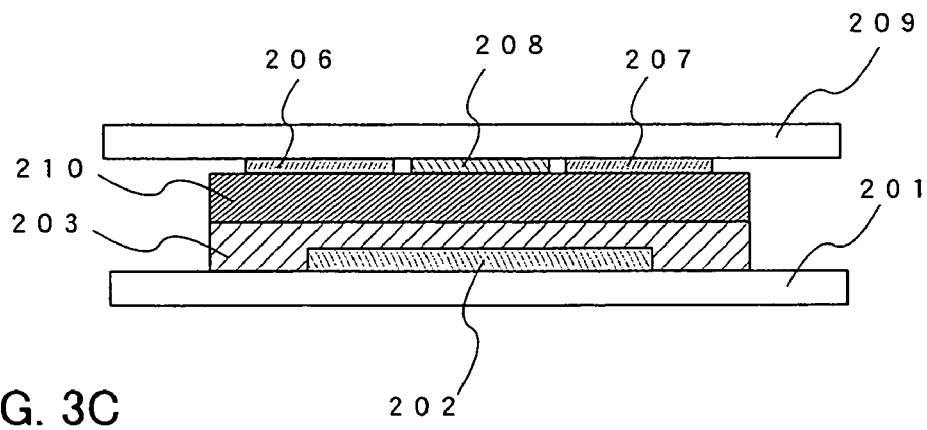

Then, the second substrate 209 provided with the orientation film 208 is made to approach to the first substrate 201 till the orientation film 208 is in contact with the organic semiconductor layer 205 (FIG. 3B). The method for making molecules in the organic semiconductor layer 205 be oriented is not limited in particular, and for example, an organic semiconductor layer 210 having orientation by the orientation film 208 is formed by activating thermal motion of the organic semiconductor layer 205 through compressing and heating the organic semiconductor layer 205 and the orientation film 208 (FIG. 3C), or the organic semiconductor layer 210 is formed through heating and melting the organic semiconductor layer 205. Further, the organic semiconductor layer 210 in which molecules are highly oriented can be formed by rapidly cooling after heating the organic semiconductor layer 205 and orienting molecules in the organic semiconductor layer 205 so that orientation does not return. Further, carrier mobility is made to be more effective when the orientation of the organic semiconductor layer 210 makes the molecules of the organic semiconductor layer 210 be oriented vertically or horizontally so that carrier mobility is improved (so that the overlap of π-π between molecules is generated in a direction which carriers flow between a source electrode and a drain electrode).

Figure 4A:
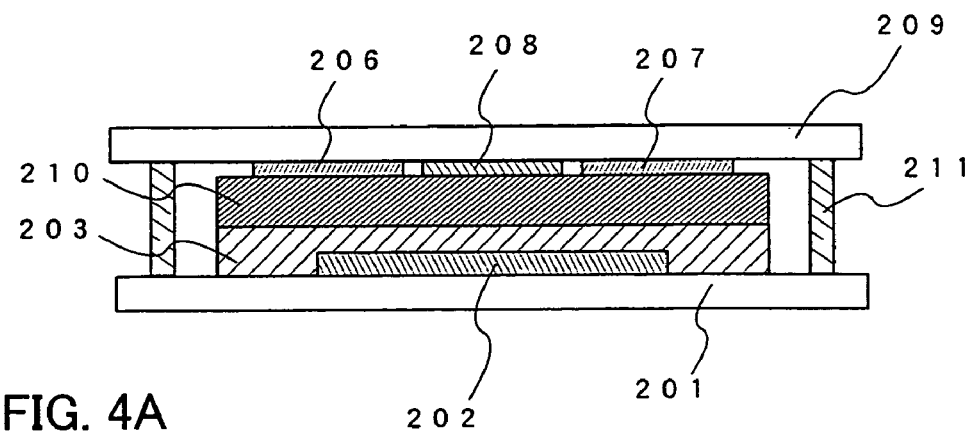
FIGS. 4A to 4C are explanatory views of a method for manufacturing a semiconductor device according to the invention.
Figure 4B:
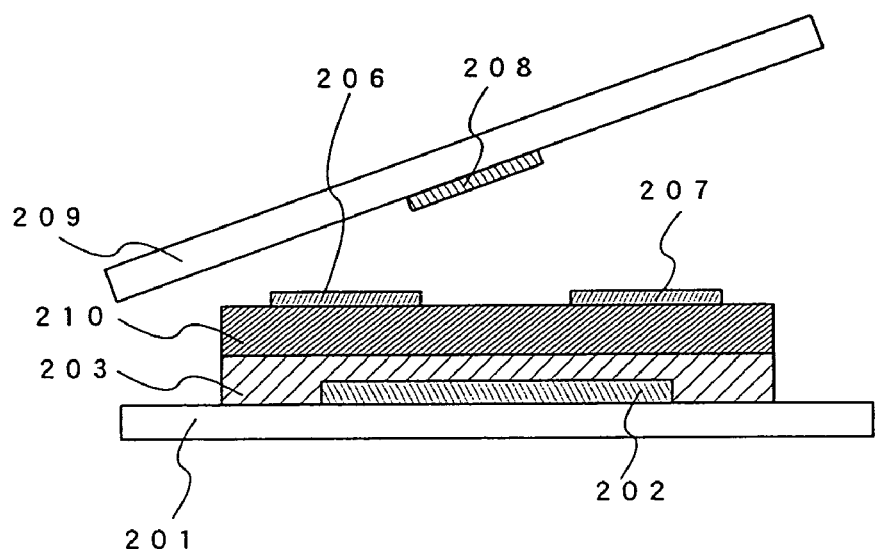

The second substrate 209 provided with the orientation film 208 can be used as a sealing substrate by being attached to the first substrate 201 by a sealing member 211 (FIG. 4A). In addition, a semiconductor device may be formed of a sealing structure by removing the second substrate 209 to provide a sealing substrate in the upper portion after forming the organic semiconductor layer 210, or a semiconductor device may be formed by adding further process such as the formation of an interlayer film (FIG. 4B).

Figure 4C:
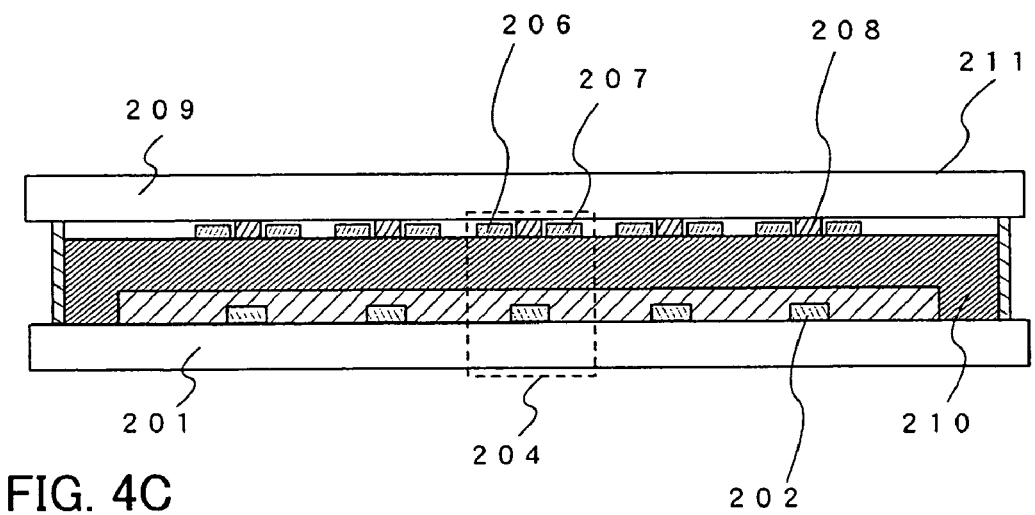

Further, a semiconductor device having a plurality of elements 204 over the first substrate 201 can be formed through a similar step (FIG. 4C).

In the semiconductor device according to the invention manufactured as described above, the orientation film 208 is at the side opposite to the gate insulator layer 203 via the organic semiconductor layer 205, in other words, molecules in the organic semiconductor layer 205 are oriented from the surface opposite to the side of the gate insulator layer 203. Accordingly, molecules in the organic semiconductor layer 210 can be oriented without damaging the organic semiconductor layer 210, and further, the planarity of an interface between the organic semiconductor layer 210 and the gate insulator layer 203 is maintained; therefore, a favorable operating characteristic is shown.

Embodiment Mode 3

One mode of a semiconductor device and a manufacturing method of the semiconductor device according to the present invention is explained with reference to FIGS. 5A to 5C and FIGS. 6A and 6B.

A gate electrode 302 is formed over a first substrate 301. The method for forming the gate electrode 302 is not limited in particular, and a deposited conductive layer may be processed in a desired shape by photolithography, or a droplet containing a conductive material may be formed by an inkjet method or the like. The material for forming the gate electrode 302 is also not limited in particular, and for example, aluminum, copper, gold, silver, or the like can be used. Further, the first substrate 301 is not limited in particular, and a substrate formed from glass, quartz, or the like, or a flexible substrate such as plastic or polycarbonate can be used.

Subsequently, a gate insulator layer 303 for covering the gate electrode 302 is formed. The method for forming the gate insulator layer 303 is not limited in particular, and for example, an insulator such as silicon oxide or silicon nitride may be deposited by a CVD method or the like, or the surface of the gate electrode may be oxidized by an anodic oxidation method. In addition, the gate insulator layer 303 may be formed by coating the first substrate 301 with an organic substance such as polyimide, polyamic acid, or polyvinylphenol by a cast method, a spinner method, a printing method, an ink-jet method, or the like.

Then, a source electrode 304 and a drain electrode 305 are formed over the gate insulator layer 303. The material of the source electrode 304 and the drain electrode 305 is not limited in particular, and an organic conductive material or the like including poly(ethylenedioxythiophene)/poly(styrene sulfonate) mixture (PEDOT/PSS) or the like besides an inorganic conductive material such as gold, silver, or tungsten may be used. Further, the method for forming the source electrode 304 and the drain electrode 305 is also not limited in particular, and a conductive layer formed using a deposition apparatus such as a sputtering apparatus or a vapor deposition system may be processed in a desired shape, or a droplet containing a conductive material may be formed by an ink-jet method or the like.

Figure 5A:
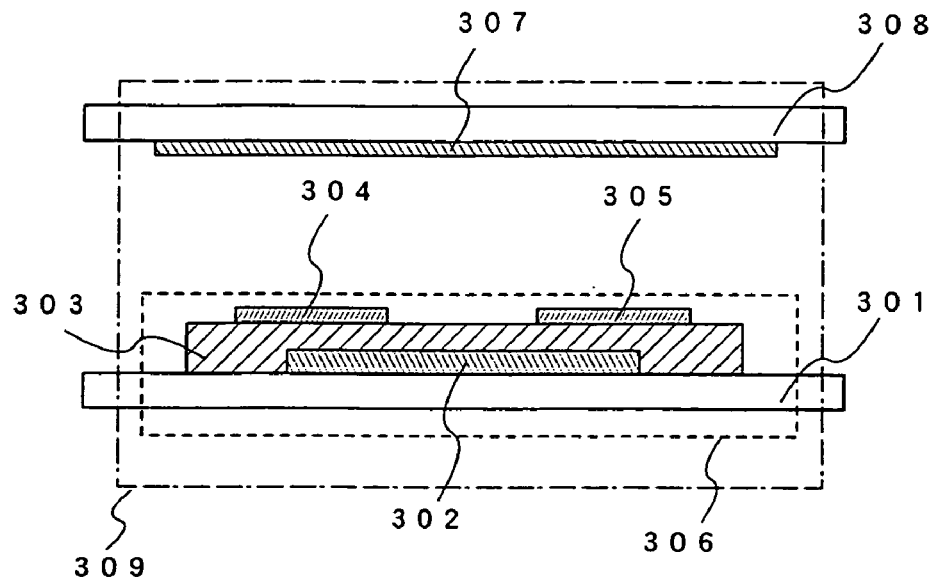
FIGS. 5A to 5C are explanatory views of a method for manufacturing a semiconductor device according to the invention.

Then, a second substrate 308 provided with an orientation film 307 is disposed so that the orientation film 307 is located inside to face the first substrate (FIG. 5A). The second substrate 308 is not limited in particular, and a substrate formed from glass, quartz, or the like, or a flexible substrate such as plastic or polycarbonate can be used. The orientation film 307 is also not limited in particular, and for example, the orientation film 307 may be formed by coating the second substrate 308 with an organic substance such as polyimide, polyvinylphenol, or polyvinyl alcohol by a cast method, a spinner method, a printing method, an ink-jet method, or the like and may be oriented by rubbing or the like.

A structure in which the first substrate 301 having an element 306 is provided with the second substrate 308 is a cell 309.

Figure 5B:
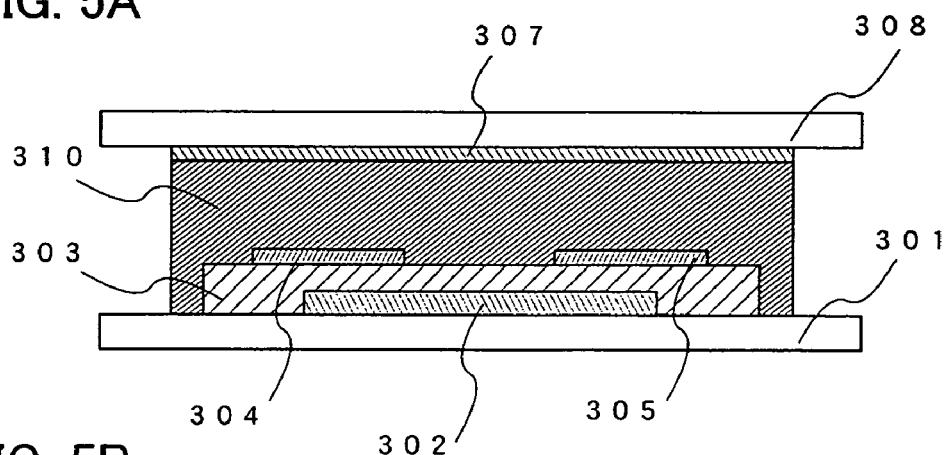

Then, an organic semiconductor layer 310 is injected into the cell 309 (FIG. 5B). The injection is not limited in particular, and a solution of the organic semiconductor layer 310 may be injected into the cell 309 with a syringe or the like or may be injected utilizing capillary phenomenon or the like by narrowing the distance between the first substrate 310 and the second substrate 308 of the cell 309. The injected molecules in the organic semiconductor layer 310 are oriented by the orientation film 307. Further, carrier mobility is made to be more effective when the orientation of molecules in the organic semiconductor layer 310 makes the molecules of the organic semiconductor layer 310 be oriented vertically or horizontally so that carrier mobility is improved (so that the overlap of π-π between molecules is generated in a direction which carriers flow between a source electrode and a drain electrode).

A structure which is made up through the above described process is an element 306.

Figure 5C:
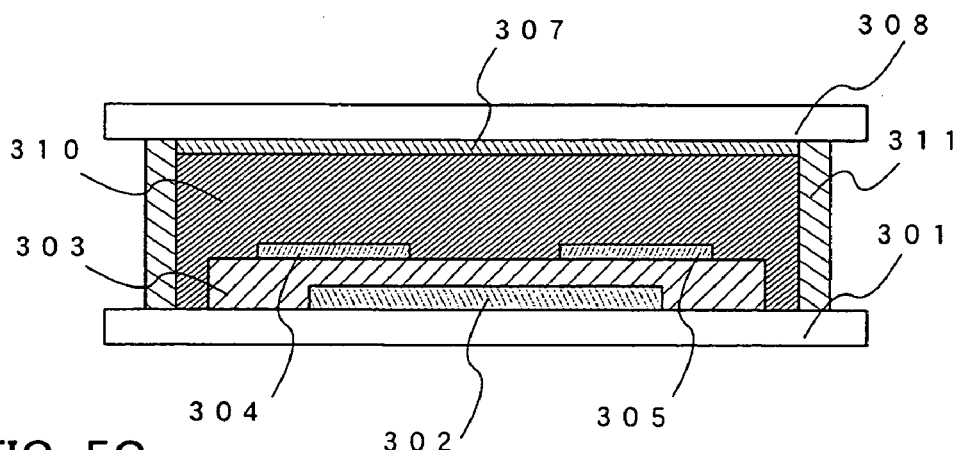
Figure 6A:
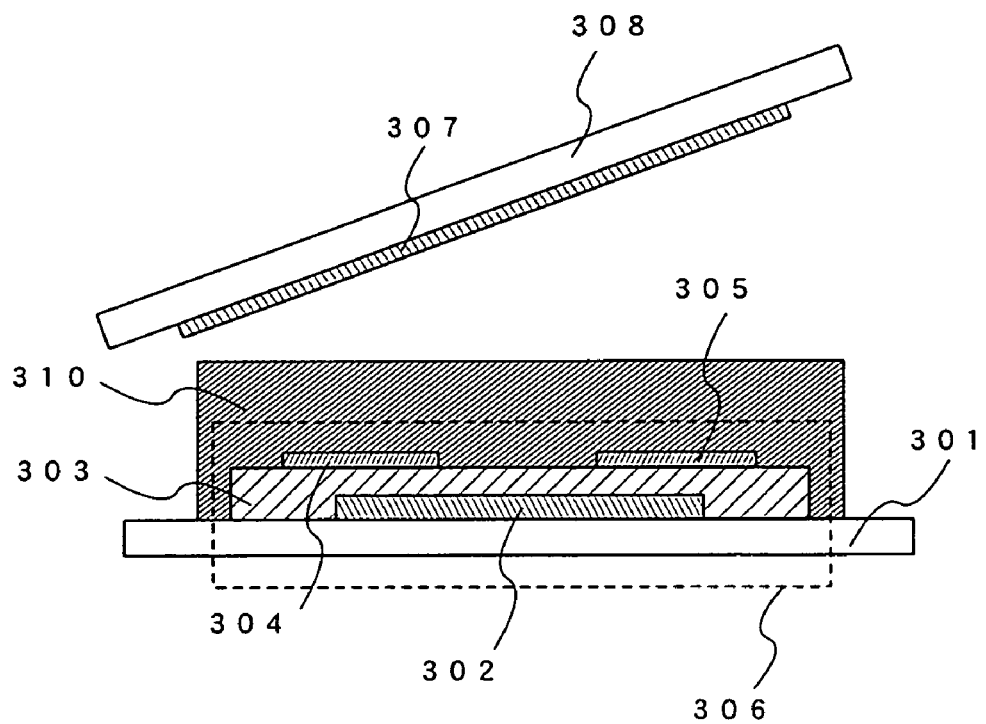
FIGS. 6A and 6B are explanatory views of a method for manufacturing a semiconductor device according to the invention.

The second substrate 308 provided with the orientation film 307 can be used as a sealing substrate by being attached to the first substrate 301 by a sealing member 311 (FIG. 5C). In addition, a semiconductor device may be formed of a sealing structure by removing the second substrate 308 to provide a sealing substrate in the upper portion after forming the organic semiconductor layer 310, or a semiconductor device may be formed by adding further process such as the formation of an interlayer film (FIG. 6A).

Figure 6B:
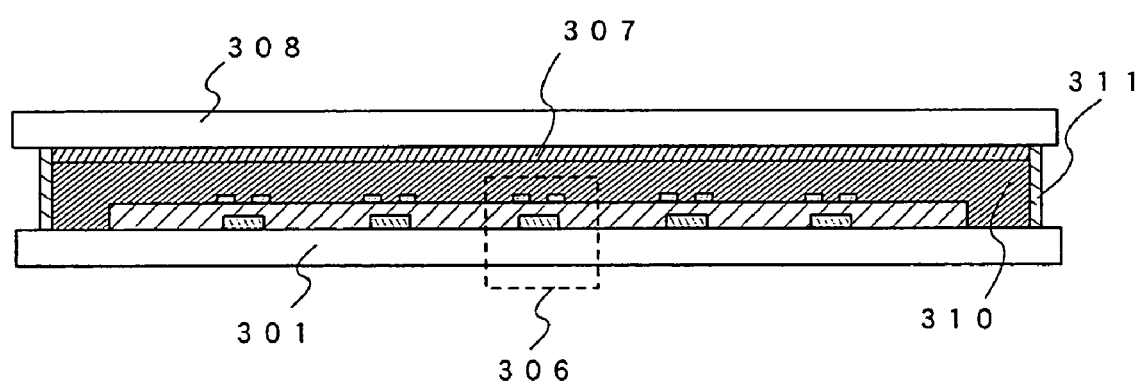

Further, a semiconductor device having a plurality of elements 306 over the first substrate 301 can be formed through a similar step (FIG. 6B).

In the semiconductor device according to the invention manufactured as described above, the orientation film 307 is at the side opposite to the gate insulator layer 303 via the organic semiconductor layer 310, in other words, molecules in the organic semiconductor layer 310 are oriented from the surface opposite to the side of the gate insulator layer 303. Accordingly, molecules in the organic semiconductor layer 310 can be oriented without damaging the organic semiconductor layer 310, and further, the planarity of an interface between the organic semiconductor layer 310 and the gate insulator layer 303 is maintained; therefore, a favorable operating characteristic is shown.

Embodiment Mode 4

One mode of a semiconductor device having a light emitting element and a manufacturing method thereof according to the present invention is explained with reference to FIGS. 7A to 7C and FIGS. 8A and 8B.

A gate electrode 402 is formed over a first substrate 401. The method for forming the gate electrode 402 is not limited in particular, and a deposited conductive layer may be processed in a desired shape by photolithography, or a droplet containing a conductive material may be formed by an ink-jet method or the like. The material for forming the gate electrode 402 is also not limited in particular, and for example, aluminum, copper, gold, silver, or the like can be used. Further, the first substrate 401 is not limited in particular, and a substrate formed from glass, quartz, or the like, or a flexible substrate such as plastic or polycarbonate can be used.

Subsequently, a gate insulator layer 403 for covering the gate electrode 402 is formed. The method for forming the gate insulator layer 403 is not limited in particular, and for example, an insulator such as silicon oxide or silicon nitride may be deposited by a CVD method or the like, or the surface of the gate electrode may be oxidized by an anodic oxidation method. In addition, the gate insulator layer 403 may be formed by coating the first substrate 401 with an organic substance such as polyimide, polyamic acid, or polyvinylphenol by a cast method, a spinner method, a printing method, an ink-jet method, or the like.

Then, a source electrode 404 and a drain electrode 405 are formed over the gate insulator layer 403. The material of the source electrode 404 and the drain electrode 405 is not limited in particular, and an organic conductive material or the like including poly(ethylenedioxythiophene)/poly(styrene sulfonate) mixture (PEDOT/PSS) or the like besides an inorganic conductive material such as gold, silver, or tungsten may be used. Further, the method for forming the source electrode 404 and the drain electrode 405 is also not limited in particular, and a conductive layer formed using a deposition apparatus such as a sputtering apparatus or a vapor deposition system may be processed in a desired shape, or a droplet containing a conductive material may be formed by an ink-jet method or the like.

And then, an anode 406 of a light emitting element is formed adjacent to the drain electrode 405 so as to be in contact with the drain electrode 405. The material of the anode 406 is not limited in particular, and an organic conductive material or the like including poly(ethylenedioxythiophene)/poly(styrene sulfonate) mixture (PEDOT/PSS) or the like besides an inorganic conductive material such as indium tin oxide, gold, silver, or tungsten may be used. Further, the method for forming the anode 406 is also not limited in particular, and a conductive layer formed using a deposition apparatus such as a sputtering apparatus or a vapor deposition system may be processed in a desired shape, or a droplet containing a conductive material may be formed by an ink-jet method or the like.

Figure 7A:
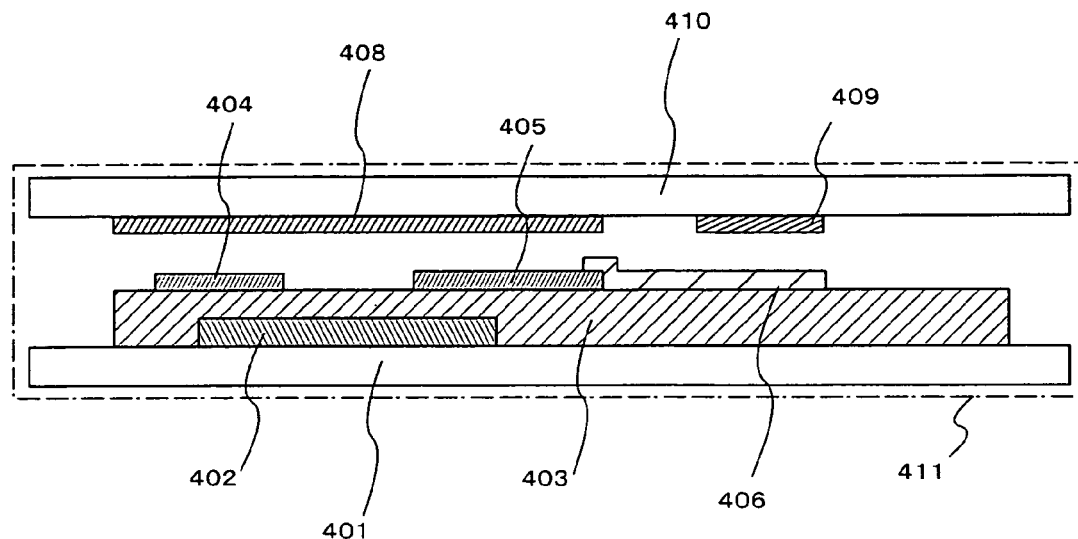
FIGS. 7A and 7B are explanatory views of a method for manufacturing a semiconductor device according to the invention.

Then, a second substrate 410 provided with an orientation film 408 and a cathode 409 of the light emitting element is disposed so that the orientation film 408 and the cathode 409 of the light emitting element are located inside to face the first substrate 401. At this time, the anode 406 of the light emitting element and the cathode 409 of the light emitting element are disposed so as to face each other (FIG. 7A). The second substrate 410 is not limited in particular, and a substrate formed from glass, quartz, or the like, or a flexible substrate such as plastic or polycarbonate can be used. The method for forming the orientation film 408 is also not limited in particular, and for example, the orientation film 408 may be formed by coating the second substrate 410 with an organic substance such as polyimide, polyvinylphenol, or polyvinyl alcohol by a cast method, a spinner method, a printing method, an ink-jet method, or the like and may be oriented by rubbing or the like. The method for forming the cathode 409 of the light emitting element is not limited in particular, and the cathode 409 of the light emitting element may be formed using an inorganic conductive material such as indium tin oxide, calcium, magnesium, or lithium, or a droplet containing a conductive material may be formed by an ink-jet method or the like.

A structure in which the first substrate 401 having an element 407 is provided with the second substrate 410 is a cell 411.

Figure 7B:
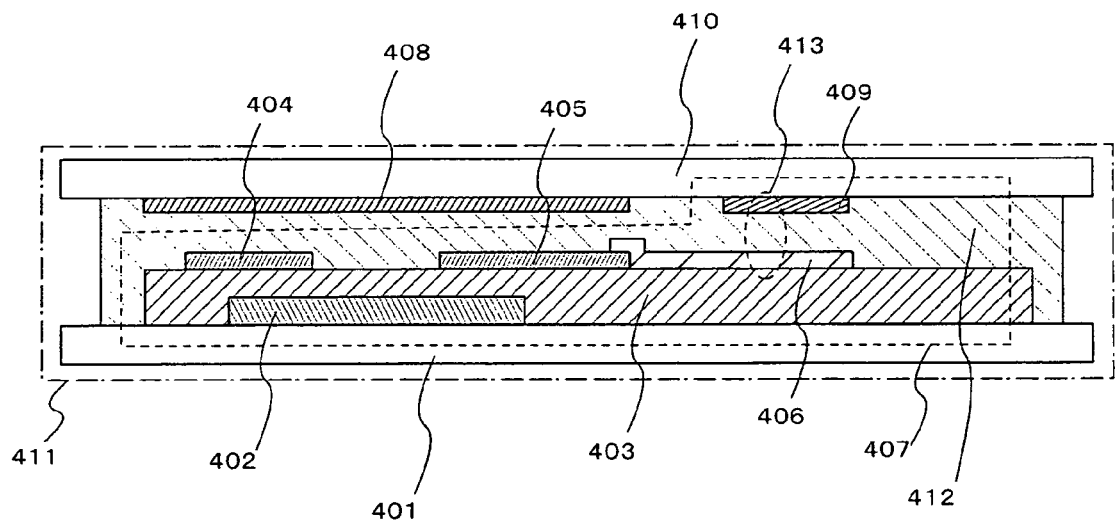

Then, an organic semiconductor layer 412 is injected in the cell 411 (FIG. 7B). The injection is not limited in particular, and a solution of the organic semiconductor layer 412 may be injected into the cell 411 with a syringe or the like or may be injected by utilizing capillary phenomenon or the like by narrowing the distance between the first substrate 401 and the second substrate 410 of the cell 411. The injected molecules in the organic semiconductor layer 412 are oriented by the orientation film 408. The method for orientation is not limited in particular, and for example, molecules in an organic semiconductor layer 412 which are oriented by rapidly cooling after heating the organic semiconductor layer 412 and orienting molecules in the organic semiconductor layer 412 so that orientation does not return can be made to maintain orientation which is uniform mostly or at high rates. Further, carrier mobility is made to be more effective when the orientation of the organic semiconductor layer 110 makes the molecules of the organic semiconductor layer 110 be oriented vertically or horizontally so that carrier mobility is improved (so that the overlap of $\pi$-$\pi$ between molecules is generated in a direction which carriers flow between a source electrode and a drain electrode). Thus, a light emitting element 413 including the anode 406, the organic compound layer 412, and the cathode 409 is formed.

Following materials are preferable to be used as the organic semiconductor material of this embodiment: P3HT (Poly(3-hexylthiophene-2,5-diyl)), F8T2 (poly(9,9'-dioctyl-fluorene-co-bithiophene), MEH-PPV (Poly(2-methoxy-5-(2'-ethyl-hexyloxy)-1,4-phenylenevinylene)), OO-PPV (Poly(2,5-dioctyloxy-1,4-phenylevinylene)), BuEH-PPV (Poly(2-butyl-5-(2'-ethylhexyl)-1,4-phenylenevinylene)), CN-PPV (Poly(2,5-hexyloxy-1,4-phenylenecyanovinylene)).

A structure which is made up through the above described process is an element 407.

Figure 8A:
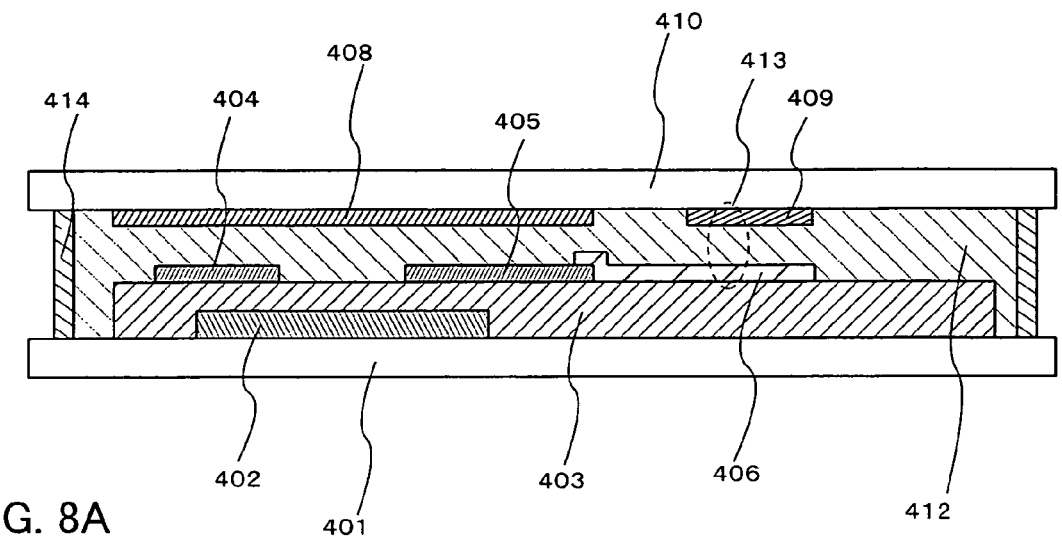
FIGS. 8A and 8B are explanatory views of a method for manufacturing a semiconductor device according to the invention.

The second substrate 410 provided with the orientation film 408 can be used as a sealing substrate by being attached to the first substrate 401 by a sealing member 414 FIG. 8A).

Figure 8B:
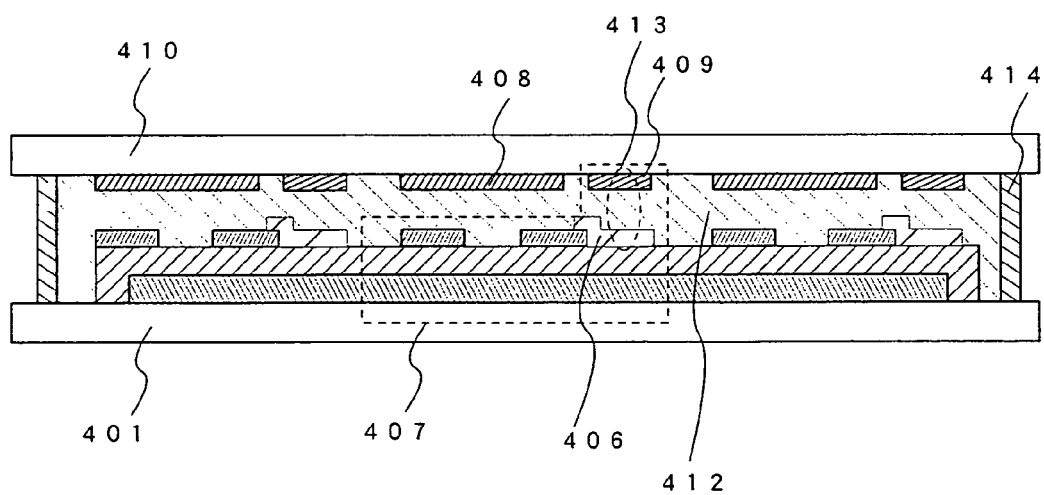

Further, a semiconductor device having a plurality of elements 407 over the first substrate 401 can be formed through a similar step (FIG. 8B).

In the semiconductor device according to the invention manufactured as described above, the orientation film 408 is at the side opposite to the gate insulator layer 403 via the organic semiconductor layer 412, in other words, molecules in the organic semiconductor layer 412 are oriented from the surface opposite to the side of the gate insulator layer 403. Accordingly, molecules in the organic semiconductor layer 412 can be oriented without damaging the organic semiconductor layer 412, and further, the planarity of an interface between the organic semiconductor layer 412 and the gate insulator layer 403 is maintained; therefore, a favorable operating characteristic is shown.

Embodiment Mode 5

Semiconductor devices formed by conducting Embodiment Mode 4 described above can be used in various electronic apparatuses. In other words, the semiconductor devices can be incorporated into display portions of electronic apparatuses as shown hereinafter.

As specific electronic apparatuses, a television receiver, a video camera, a digital camera, a projector, a head mounted display (goggle type display), a car navigation system, a car stereo, a personal computer, a handheld terminal (mobile computer, cellular phone, electronic book, or the like) and the like are given. Some examples thereof are shown in FIGS. 9A to 9E and FIG. 10.

Figure 9A:
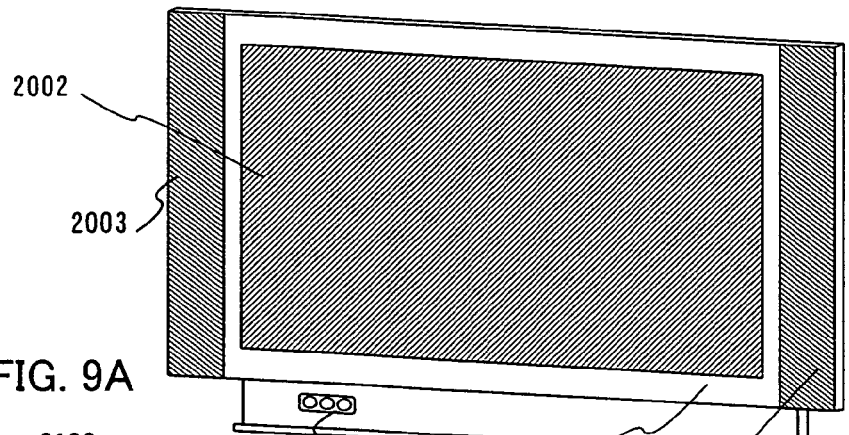
FIGS. 9A to 9E are views showing one example of an electronic apparatus.

FIG. 9A shows a television receiver, which can be completed by incorporating a semiconductor device shown in Embodiment Mode 4 into a chassis 2001. A display screen 2002 is formed by a semiconductor device. In addition, a speaker 2003, an operation switch 2004, and the like are arbitrarily provided.

A semiconductor device incorporated into a television receiver has favorable characteristics that the increase of OFF current and gate leak current are more suppressed than a conventional semiconductor device; therefore, a television receiver including the semiconductor device can suppress power consumption to a minimum.

Figure 9B:
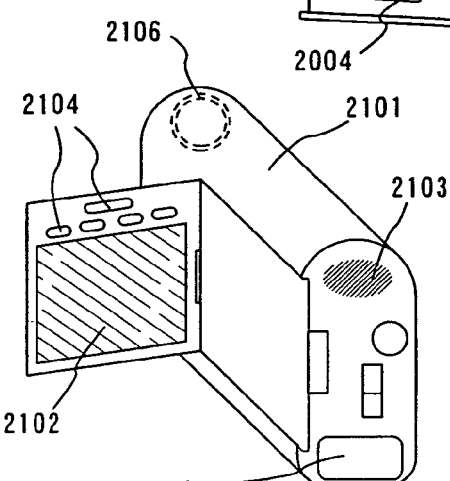

FIG. 9B shows a video camera, which includes a main body 2101, a display portion 2102, an audio input portion 2103, operation switches 2104, a battery 2105, an image receiving portion 2106, and the like. The display portion 2102 is formed by a semiconductor device.

A semiconductor device incorporated into a video camera has favorable characteristics that the increase of OFF current and gate leak current are more suppressed than a conventional semiconductor device; therefore, a video camera including the semiconductor device can suppress power consumption to a minimum.

Figure 9C:
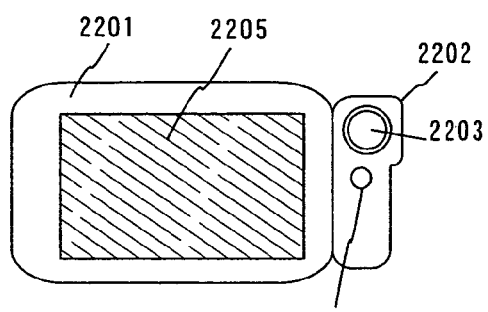

FIG. 9C shows a mobile computer, which includes a main body 2201, a camera portion 2202, an image receiving portion 2203, an operation switch 2204, a display portion 2205, and the like. The display portion 2205 is formed by a semiconductor device.

A semiconductor device incorporated into a mobile computer has favorable characteristics that the increase of OFF current and gate leak current are more suppressed than a conventional semiconductor device; therefore, a mobile computer including the semiconductor device can suppress power consumption to a minimum.

Figure 9D:
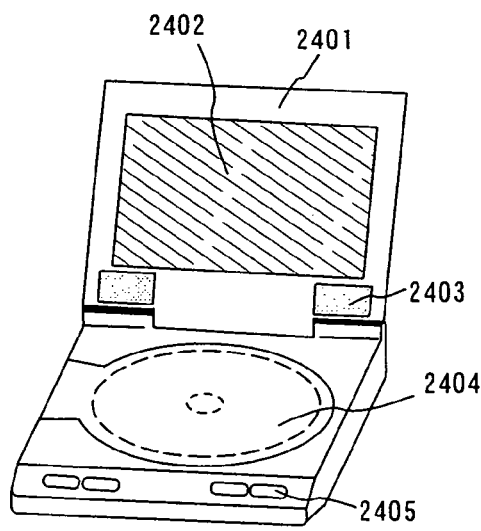

FIG. 9D shows a player using a recording medium in which a program is recorded (hereinafter, referred to as recording medium), which includes a main body 2401, a display portion 2402, a speaker portion 2403, a recording medium 2404, an operation switch 2405, and the like. This player makes it possible to enjoy listening to the music, watching the movie, playing the game, and playing on the Internet using a DVD, a CD, or the like as the recording medium. The display portion 2402 is formed by a semiconductor device.

A semiconductor device incorporated into a recording medium has favorable characteristics that the increase of OFF current and gate leak current are more suppressed than a conventional semiconductor device; therefore, a recording medium including the semiconductor device can suppress power consumption to a minimum.

Figure 9E:
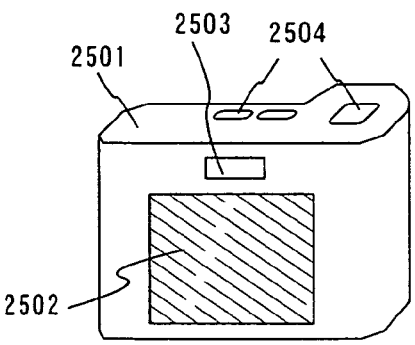

FIG. 9E shows a digital camera, which includes a main body 2501, a display portion 2502, an eye piece 2503, operation switches 2504, an image receiving portion (not shown), and the like. The display portion 2502 is formed by a semiconductor device.

A semiconductor device incorporated into a digital camera has favorable characteristics that the increase of OFF current and gate leak current are more suppressed than a conventional semiconductor device; therefore, a digital camera including the semiconductor device can suppress power consumption to a minimum.

Figure 10:
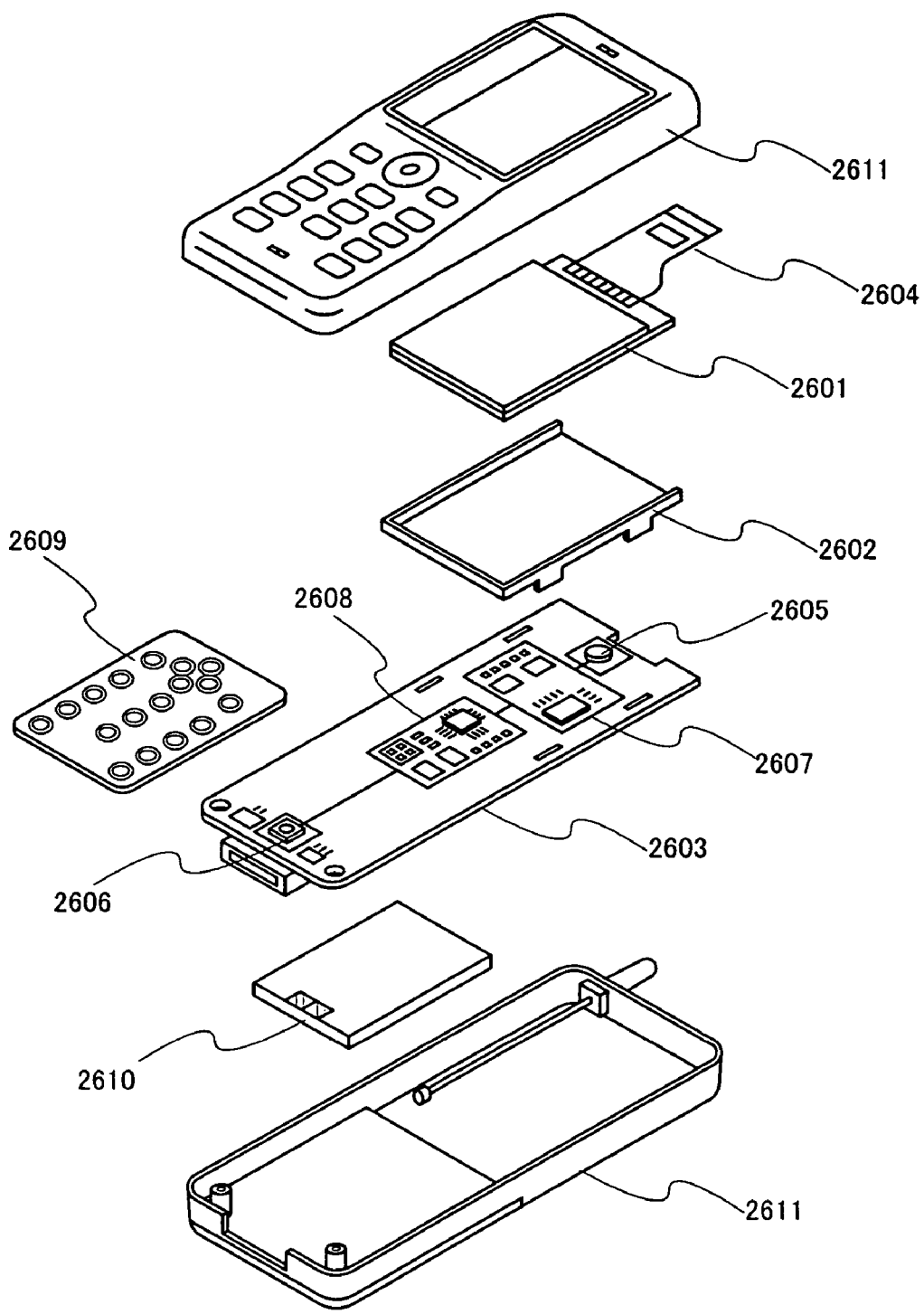
FIG. 10 is a view showing one example of an electronic apparatus.

FIG. 10 shows one mode of a cellular phone including a semiconductor device shown in Embodiment Mode 4. A semiconductor device 2601 is incorporated into a housing 2602 so as to be freely detached/attached. The shape and measurement of the housing 2602 can be arbitrarily changed depending on the size of the semiconductor device 2601. The housing 2602 fixing the semiconductor device 2601 is fitted into a printed wiring board 2603 to be assembled as a module.

The semiconductor device 2601 is connected to the printed wiring board 2603 through a FPC 2604. A speaker 2605, a microphone 2606, a transmission and reception circuit 2607, a signal processing circuit 2608 including a CPU, a controller, and the like are formed over the printed wiring board 2603. Such a module is combined with an input means 2609 and a battery 2610 to be placed in a chassis 2611. The display portion of the semiconductor device 2601 is disposed so as to be visibly confirmed from an opening window formed in the chassis 2611.

A semiconductor device incorporated into a cellular phone has favorable characteristics that the increase of OFF current and gate leak current are more suppressed than a conventional semiconductor device; therefore, a cellular phone including the semiconductor device can suppress power consumption to a minimum.

A cellular phone according to this embodiment mode can be freely transformed into various modes depending on the function and use of the cellular phone. For example, the above-described advantageous effect can be achieved even if a structure providing a plurality of semiconductor devices or an opening and shutting structure using a hinge by dividing a chassis into a plurality of pieces arbitrarily is employed.

As described above, the applicable range of the invention is so wide that the invention can be applied to electronic apparatuses of various fields.

This application is based on Japanese Patent Application serial No. 2004-315141 field in Japan Patent Office on Oct. 29, 2004, the contents of which are hereby incorporated by reference.

What is claimed is:

1. A method for manufacturing a semiconductor device comprising the steps of:
   forming a gate electrode over a first substrate;
   forming an insulator over the gate electrode;
   forming an organic semiconductor film, a source electrode and a drain electrode, over the insulator;
   forming an orientation film over a second substrate;
   rubbing the orientation film to be oriented; and
   attaching the second substrate to the first substrate after rubbing the orientation film so that the orientation film is in contact with the organic semiconductor film, at least partly,
   wherein an interface between the organic semiconductor film in a region which forms a channel and the insulator is planar.

2. The method for manufacturing a semiconductor device according to claim 1, wherein the organic semiconductor film comprises one selected from the group consisting of polythiophene, polyparaphenylene vinylene, pentacene and phthalocyanine.

3. The method for manufacturing a semiconductor device according to claim 1, wherein the orientation film is one selected from the group consisting of a film processed by the rubbing method, an oblique deposition film using SiO, a film having a surface on which macromolecule chain are stretched, a film processed by a surfactant such as silane compound, and a film irradiated by a polarized ultraviolet light.

4. A method for manufacturing an electronic device comprising the semiconductor device according to claim 1, wherein the electronic device is one selected from the group consisting of a television receiver, a video camera, a mobile computer, a player using a recording medium in which a program is recorded, a digital camera, a cellular phone.

5. A method for manufacturing a semiconductor device comprising the steps of:
   forming a gate electrode over a first substrate;
   forming an insulator over the gate electrode;
   forming a source electrode, a drain electrode, and an organic semiconductor film on the insulator;
   forming an orientation film over a second substrate;
   rubbing the orientation film to be oriented; and
   attaching the second substrate to the first substrate after rubbing the orientation film so that the orientation film is in contact with the organic semiconductor film, at least partly;
   heating the organic semiconductor film after attaching the second substrate to the first substrate; and
   rapid cooling the organic semiconductor film after heating the organic semiconductor film,
   wherein an interface between the organic semiconductor film in a region which forms a channel and the insulator is planar.

6. The method for manufacturing a semiconductor device according to claim 5, wherein the organic semiconductor film comprises one selected from the group consisting of polythiophene, polyparaphenylene vinylene, pentacene and phthalocyanine.

7. The method for manufacturing a semiconductor device according to claim 5, wherein the orientation film is one selected from the group consisting of a film processed by the rubbing method, an oblique deposition film using SiO, a film having a surface on which macromolecule chain are stretched, a film processed by a surfactant such as silane compound, and a film irradiated by a polarized ultraviolet light.

8. A method for manufacturing an electronic device comprising the semiconductor device according to claim 5, wherein the electronic device is one selected from the group consisting of a television receiver, a video camera, a mobile computer, a player using a recording medium in which a program is recorded, a digital camera, a cellular phone.

9. A method for manufacturing a semiconductor device comprising the steps of:
   forming a gate electrode, an insulator layer, a source electrode and a drain electrode, over a first surface of a first substrate;
   forming an orientation film over a second surface of a second substrate;
   rubbing the orientation film to be oriented;
   attaching the second substrate to the first substrate by a sealing member after rubbing the orientation film, wherein the first surface faces to the second surface;
   injecting an organic semiconductor material to fill a space surrounded by the sealing member, the first surface and the second surface, after attaching the first substrate and the second substrate,
   wherein the gate electrode is formed over the first surface of the first substrate,
   wherein the insulator layer is formed over the gate electrode, wherein the source electrode and the drain electrode is formed over the insulator layer, and wherein an interface between the injected organic semiconductor material in a region which forms a channel and the insulator layer is planar.

10. The method for manufacturing a semiconductor device according to claim 9, wherein the organic semiconductor material comprises one selected from the group consisting of polythiophene, polyparaphenylene vinylene, pentacene and phthalocyanine.

11. The method for manufacturing a semiconductor device according to claim 9, wherein the orientation film is one selected from the group consisting of a film processed by the rubbing method, an oblique deposition film using SiO, a film having a surface on which macromolecule chain are stretched, a film processed by a surfactant such as silane compound, and a film irradiated by a polarized ultraviolet light.

12. A method for manufacturing an electronic device comprising the semiconductor device according to claim 9, wherein the electronic device is one selected from the group consisting of a television receiver, a video camera, a mobile computer, a player using a recording medium in which a program is recorded, a digital camera, a cellular phone.

13. A semiconductor device comprising:
a first substrate having an insulating surface;
a first conductive film over the first substrate;
an insulating film over the first conductive film;
a pair of second conductive films over the insulating film;
an organic semiconductor film over the pair of second conductive films and the insulating film, wherein an interface between the organic semiconductor film located between the pair of second conductive films and the insulating film is planar;
an orientation film, which is oriented by rubbing, on and at least partly in contact with the organic semiconductor film; and
a second substrate over the orientation film, and
wherein orientation of the organic semiconductor film is maintained by performing heating and rapid cooling of the organic semiconductor film.

14. The semiconductor device according to claim 13, wherein organic semiconductor film comprises one selected from the group consisting of polythiophene, polyparaphenylene vinylene, pentacene and phthalocyanine.

15. The semiconductor device according to claim 13, wherein the orientation film is one selected from the group consisting of a film processed by the rubbing method, an oblique deposition film using SiO, a film having a surface on which macromolecule chain are stretched, a film processed by a surfactant such as silane compound, and a film irradiated by a polarized ultraviolet light.

16. An electronic device comprising the semiconductor device according to claim 13, wherein the electronic device is one selected from the group consisting of a television receiver, a video camera, a mobile computer, a player using a recording medium in which a program is recorded, a digital camera, a cellular phone.

17. A semiconductor device comprising:
a first substrate having an insulating surface;
a first conductive film over the first substrate;
an insulating film over the first conductive film;
an organic semiconductor film over the insulating film;
a pair of second conductive films over the organic semiconductor film;
an orientation film, which is oriented by rubbing, on and at least partly in contact with the organic semiconductor film, and
a second substrate provided on the orientation film and the pair of second conductive films,
wherein at least a part of the orientation film is provided between the pair of second conductive films, and
wherein orientation of the organic semiconductor film is maintained by performing heating and rapid cooling of the organic semiconductor film.

18. The semiconductor device according to claim 17, wherein organic semiconductor material comprises one selected from the group consisting of polythiophene, polyparaphenylene vinylene, pentacene and phthalocyanine.

19. The semiconductor device according to claim 17, wherein the orientation film is one selected from the group consisting of a film processed by the rubbing method, an oblique deposition film using SiO, a film having a surface on which macromolecule chain are stretched, a film processed by a surfactant such as silane compound, and a film irradiated by a polarized ultraviolet light.

20. An electronic device comprising the semiconductor device according to claim 17, wherein the electronic device is one selected from the group consisting of a television receiver, a video camera, a mobile computer, a player using a recording medium in which a program is recorded, a digital camera, a cellular phone.

* * * * *